US012653009B2

(12) United States Patent
Latham et al.

(10) Patent No.: US 12,653,009 B2
(45) Date of Patent: Jun. 9, 2026

(54) NEGATIVE-TONE ORGANIC DIELECTRIC WITH FINE METAL PILLAR RESOLUTION

(71) Applicant: INTERNATIONAL BUSINESS MACHINES CORPORATION, Armonk, NY (US)

(72) Inventors: Nicholas Latham, Albany, NY (US); Junwon Han, Loudonville, NY (US); Kishan Jayanand, Cohoes, NY (US); Nicholas Alexander Polomoff, Hopewell Junction, NY (US); Aakrati Jain, Albany, NY (US); Mary McGahay, Troy, NY (US); Sathyanarayanan Raghavan, Ballston Lake, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 393 days.

(21) Appl. No.: 18/496,966

(22) Filed: Oct. 30, 2023

(65) Prior Publication Data
US 2025/0140609 A1 May 1, 2025

(51) Int. Cl.
*H10W 20/00* (2026.01)
*H10P 95/00* (2026.01)
*H10W 20/48* (2026.01)
*H10W 90/00* (2026.01)

(52) U.S. Cl.
CPC ........... *H10W 20/063* (2026.01); *H10P 95/08* (2026.01); *H10W 20/48* (2026.01); *H10W 90/701* (2026.01)

(58) Field of Classification Search
CPC . H10W 20/063; H10W 20/48; H10W 90/701; H10P 95/08
See application file for complete search history.

(56) References Cited

U.S. PATENT DOCUMENTS

| | | | |
|---|---|---|---|
| 5,677,238 A | 10/1997 | Gn | |
| 7,790,509 B2 | 9/2010 | Gerber | |
| 8,841,779 B2 | 9/2014 | Pendse | |
| 9,165,885 B2 | 10/2015 | Yu | |
| 10,742,217 B2 | 8/2020 | Dabral | |
| 11,177,165 B2 | 11/2021 | Liu | |
| 11,488,908 B2 | 11/2022 | Yu | |
| 2011/0101527 A1 | 5/2011 | Cheng | |
| 2015/0380350 A1 | 12/2015 | Yu | |

(Continued)

OTHER PUBLICATIONS

Nimbalkar et al., "Fabrication and reliability demonstration of 5μm redistribution layer using low-stress dielectric dry film", 2020 IEEE 70th Electronic Components and Technology Conference (ECTC), Conference Paper • Jun. 2020, 7 pages.

*Primary Examiner* — Tucker J Wright
(74) *Attorney, Agent, or Firm* — Yuanmin Cai

(57) ABSTRACT

Embodiments of present invention provide a method. The method includes forming a set of metal pillars on a substrate; forming a negative-tone organic dielectric layer covering the set of metal pillars; planarizing the negative-tone organic dielectric layer to expose the set of metal pillars; forming a resist mask on the negative-tone organic dielectric layer, the resist mask having openings that expose the set of metal pillars; and forming a redistribution layer in the openings of the resist mask, the redistribution layer being in direct contact with the set of metal pillars. A structure formed thereby is also provided.

13 Claims, 4 Drawing Sheets

(56) References Cited

U.S. PATENT DOCUMENTS

| | | |
|---|---|---|
| 2018/0286830 A1 | 10/2018 | Yu |
| 2018/0301350 A1 | 10/2018 | Haba |
| 2020/0253037 A1 | 8/2020 | Marin |
| 2022/0068779 A1 | 3/2022 | Kweon |
| 2022/0084874 A1* | 3/2022 | Wang .................. H10W 20/063 |
| 2022/0302038 A1 | 9/2022 | Yu |

* cited by examiner

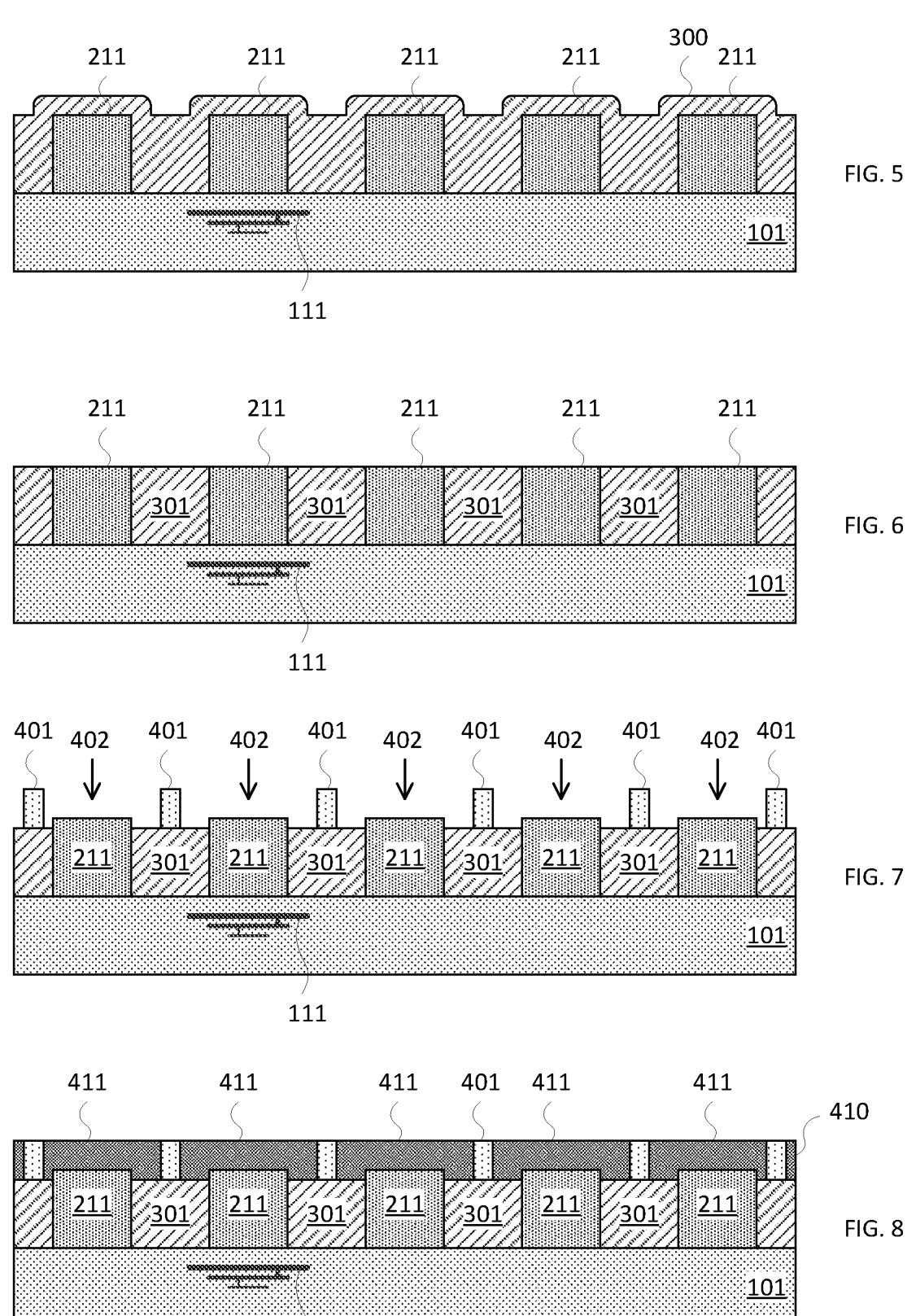

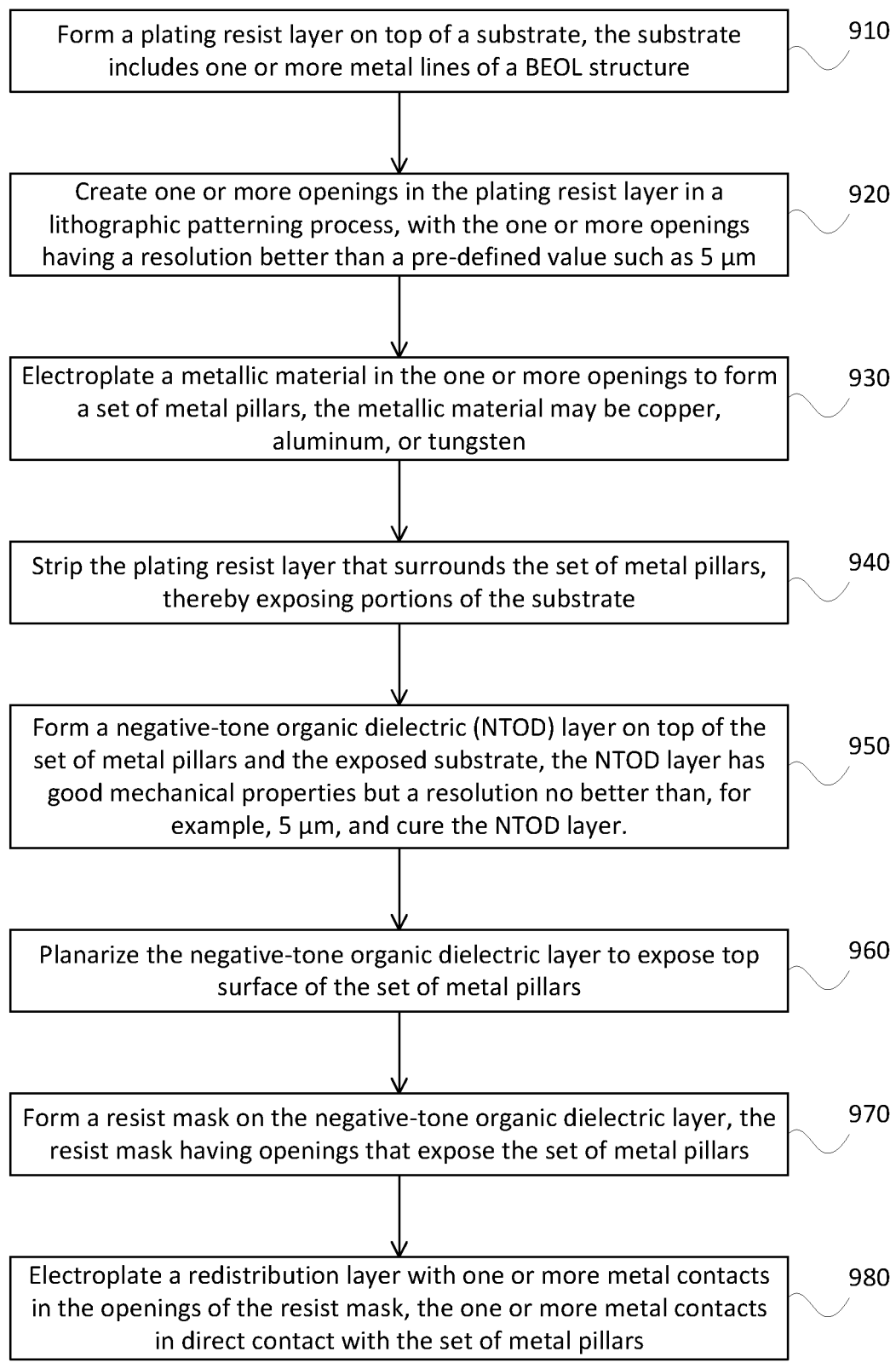

Form a plating resist layer on top of a substrate, the substrate includes one or more metal lines of a BEOL structure    910

Create one or more openings in the plating resist layer in a lithographic patterning process, with the one or more openings having a resolution better than a pre-defined value such as 5 μm    920

Electroplate a metallic material in the one or more openings to form a set of metal pillars, the metallic material may be copper, aluminum, or tungsten    930

Strip the plating resist layer that surrounds the set of metal pillars, thereby exposing portions of the substrate    940

Form a negative-tone organic dielectric (NTOD) layer on top of the set of metal pillars and the exposed substrate, the NTOD layer has good mechanical properties but a resolution no better than, for example, 5 μm, and cure the NTOD layer.    950

Planarize the negative-tone organic dielectric layer to expose top surface of the set of metal pillars    960

Form a resist mask on the negative-tone organic dielectric layer, the resist mask having openings that expose the set of metal pillars    970

Electroplate a redistribution layer with one or more metal contacts in the openings of the resist mask, the one or more metal contacts in direct contact with the set of metal pillars    980

FIG. 12

NEGATIVE-TONE ORGANIC DIELECTRIC WITH FINE METAL PILLAR RESOLUTION

BACKGROUND

The present application relates to manufacturing of semiconductor integrated circuits. More particularly, it relates to forming metal pillars with fine resolution in connection with the use of negative-tone organic dielectric, and the structure formed thereby.

A semiconductor integrated circuitry generally includes front-end-of-line (FEOL) devices, middle-of-line (MOL) interconnects that connect to the FEOL devices, and a back-end-of-line (BEOL) structure that provide power and signal routing to the FEOL devices via the MOL interconnects. The integrated circuitry is then packaged with metal pillars and one or more redistribution layers that together provide contact areas to accommodate C4 (controlled collapse of chip connection) solders.

Generally, during the packaging process, metal pillars and redistribution layers are formed through a maskless patterning process using negative-tone organic dielectric. Good mechanical properties of the negative-tone organic dielectric are essential for the integrity and long-term reliability of the package. However, it is known that there is a trade-off between mechanical properties and resolution in commonly used negative-tone organic dielectrics. By having sufficiently acceptable mechanical properties, the negative-tone organic dielectric often has a resolution that is not enough for advanced node application. For example, the negative-tone organic dielectric may not be able to produce metal pillars that are moderately fine in resolution such as below 5 μm.

SUMMARY

Embodiments of present invention provide a method. The method includes forming a set of metal pillars on a substrate; forming a negative-tone organic dielectric layer covering the set of metal pillars; planarizing the negative-tone organic dielectric layer to expose the set of metal pillars; forming a resist mask on the negative-tone organic dielectric layer, the resist mask having openings that expose the set of metal pillars; and forming a redistribution layer in the openings of the resist mask, the redistribution layer being in direct contact with the set of metal pillars.

In one embodiment, forming the set of metal pillars includes forming a plating resist layer on top of the substrate; creating openings in the plating resist layer; forming the set of metal pillars in the openings of the plating resist layer through an electroplating process; and stripping the plating resist layer that surrounds the set of metal pillars.

In another embodiment, at least one of the metal pillars has a horizontal dimension that is less than 5 μm.

According to one embodiment, the method further includes curing the negative-tone organic dielectric layer through a flood exposure for a duration between about 100 ms and about 1000 ms and under an energy dose ranging from about 200 mJ/cm² to about 1000 mJ/cm2 with ghi-line or i-line wavelength.

In one embodiment, both the redistribution layer and the set of metal pillars are made of copper.

In another embodiment, the substrate includes one or more metal layers of a back-end-of-line (BEOL) structure, and the set of metal pillars are conductively connected to the one or more metal layers.

According to another embodiment, the method further includes forming one or more C4 solders on top of and in direct contact with the redistribution layer.

Embodiments of present invention also provide a semiconductor structure. The structure includes a negative-tone organic dielectric layer on top of a substrate; and a set of metal pillars embedded in the negative-tone organic dielectric layer, where at least one of the metal pillars has a horizontal dimension less than 5 μm.

According to one embodiment, the structure further includes a redistribution layer on top of and in direct contact with the set of metal pillars.

In one embodiment, the set of metal pillars include a portion that extrudes from the negative-tone organic dielectric layer and the redistribution layer saddles on top of the extruded portion of the set of metal pillars.

In another embodiment, both the redistribution layer and the set of metal pillars are made of copper.

According to another embodiment, the structure further includes a set of C4 solders on top of and in direct contact with the redistribution layer.

In one embodiment, the negative-tone organic dielectric layer has a resolution no better than 5 μm.

In another embodiment, the substrate includes one or more metal layers of a back-end-of-line (BEOL) structure, and the set of metal pillars are conductively connected to the one or more metal layers.

BRIEF DESCRIPTION OF THE DRAWINGS

The present invention will be understood and appreciated more fully from the following detailed description of embodiments of present invention, taken in conjunction with accompanying drawings of which:

FIGS. 1-11 are demonstrative illustrations of cross-sectional views of a semiconductor structure in various steps of manufacturing thereof according to embodiments of present invention; and FIG. 12 is a demonstrative illustration of a flow-chart of a method of manufacturing a semiconductor structure according to embodiments of present invention.

Figures 1, 2, 3, 4:
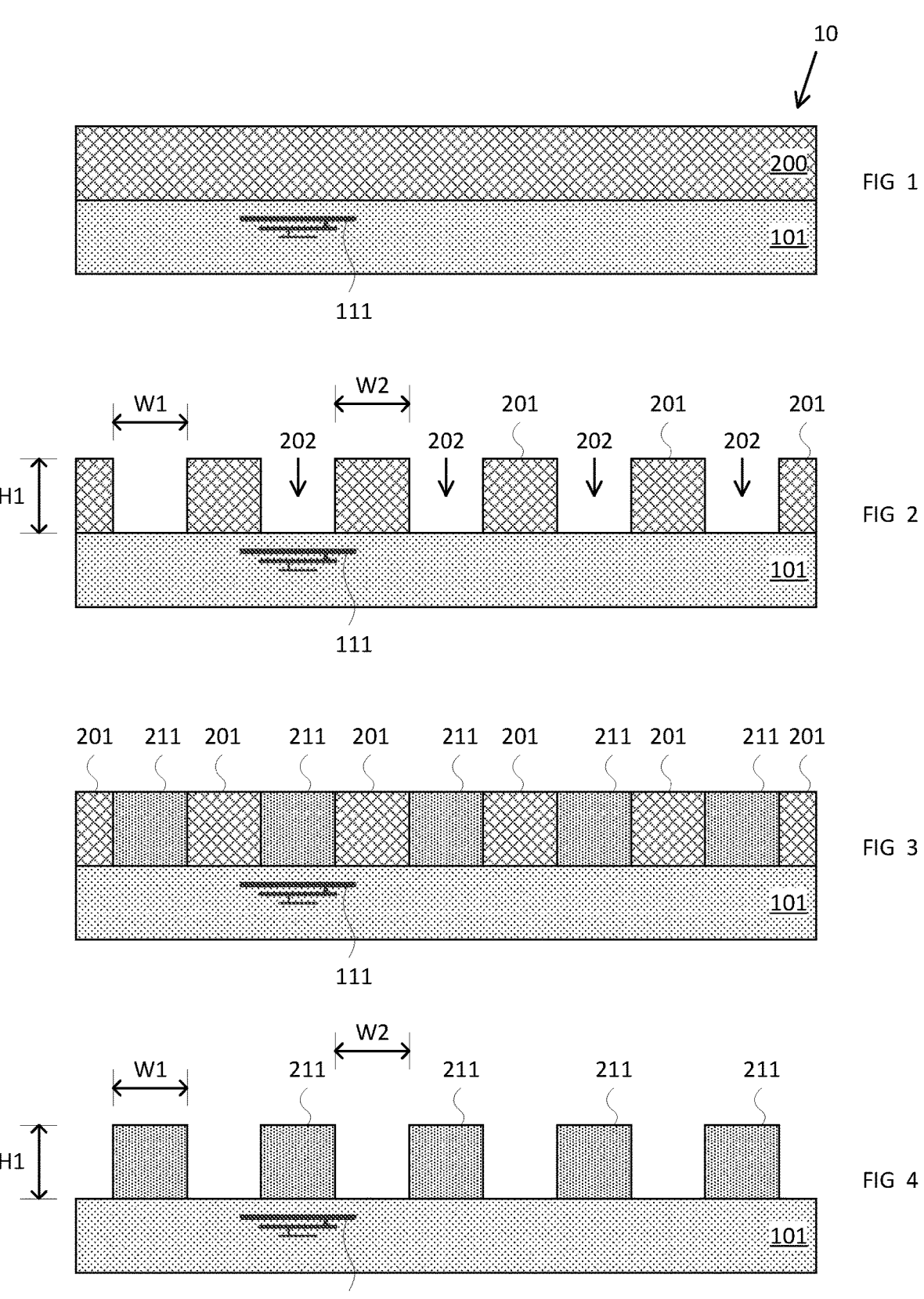

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a semiconductor structure in a step of manufacturing thereof according to one embodiment of present invention. More particularly, embodiments of present invention provide receiving or providing a supporting structure such as, for example, a substrate 101 and forming a plating resist layer 200 on top of the substrate 101. In one embodiment, the substrate 101 may be a semiconductor substrate and may include or may be processed to include one or more metal lines of a back-end-of-line (BEOL) structure 111. The BEOL structure 111 maybe formed to provide power and/or signal routing to one or more front-end-of-line (FEOL) devices through middle-of-line (MOL) interconnects.

FIG. 2 is a demonstrative illustration of cross-sectional view of a semiconductor structure in a step of manufacturing thereof according to one embodiment of present invention. More particularly, following the step illustrated in FIG. 1, embodiments of present invention provide patterning the plating resist layer 200, for example, through a lithographic patterning process, to form a resist mask 201 containing one or more openings 202 that are patterned to form one or more metal pillars. Unlike a negative-tone organic dielectric such as a photo-imageable dielectric (PID), the plating resist layer 200 is a photosensitive polymer-based material, which allows patterning with a resolution better than 5 μm and may be up to 1 μm, and therefore may be able to provide or produce the resist mask 201 which typically requires sub-5 μm resolution. For example, with a thickness H1 of at least 5 μm of the resist mask 201, the one or more openings 202 created in the plating resist layer 200 may have a horizontal width W1 that is less than 5 μm. Portions of the resist mask 201 that cover the substrate 101 may have a horizontal width W2 that is less than 5 μm as well. Plating resists are typically employed in an electroplating process to form or put down interconnects and redistribution layer (RDL) metals such as, for example, copper (Cu) and they are easily strippable post the electroplating process.

FIG. 3 is a demonstrative illustration of cross-sectional view of a semiconductor structure in a step of manufacturing thereof according to one embodiment of present invention. More particularly, following the step illustrated in FIG. 2, embodiments of present invention provide forming a set of metal pillars 211 in the one or more openings 202 created in the plating resist layer 200. For example, in one embodiment, forming the set of metal pillars 211 may include electroplating a metallic material in the one or more openings 202. The metallic material may include, for example, copper (Cu), aluminum (Al), tungsten (W), and other suitable materials. Here, it is to be noted that the word "set" may include one. In other words, the set of metal pillars 211 may include one or more metal pillars.

FIG. 4 is a demonstrative illustration of cross-sectional view of a semiconductor structure in a step of manufacturing thereof according to one embodiment of present invention. More particularly, following the step illustrated in FIG. 3, embodiments of present invention provide, after forming the set of metal pillars 211, stripping the resist mask 201 off the substrate 101 thereby leaving the set of metal pillars 211 standing on the substrate 101. By the nature that the set of metal pillars 211 are formed through electroplating the metallic material in the one or more openings 202, at least some of the metal pillars 211 may have a width W1 and a height H1, and may be separated by an opening with a width W2.

FIG. 5 is a demonstrative illustration of cross-sectional view of a semiconductor structure in a step of manufacturing thereof according to one embodiment of present invention. More particularly, following the step illustrated in FIG. 4, embodiments of present invention provide forming a raw negative-tone organic dielectric layer 300 on top of and covering the set of metal pillars 211. In one embodiment, the raw negative-tone organic dielectric layer 300 may be a layer of photo-imageable dielectric, which may be selected to have good mechanical properties. Since resolution of the set of metal pillars 211 are defined by the resist mask 201, resolution of the raw negative-tone organic dielectric layer 300 is less important or no longer important. For example, the raw negative-tone organic dielectric layer 300 may have a relatively low resolution such as, for example, no better than 5 μm.

The raw negative-tone organic dielectric layer 300 may be coated through, for example, a spin-on process to cover top surfaces of the set of metal pillars 211 and the exposed portions of the substrate 101. The raw negative-tone organic dielectric layer 300 may be coated to have a thickness at least covering the height of the set of metal pillars 211. After the coating, the raw negative-tone organic dielectric layer 300 may be subjected to a flood exposure, for example, for a duration between about 100 milliseconds (ms) and about 1000 ms and under an energy dose ranging from about 200 mJ/cm² to about 1000 mJ/cm² with, for example, 2000 W ghi-line or i-line wavelengths. The raw negative-tone organic dielectric layer 300 may be cured through such flood exposure to form crosslink.

FIG. 6 is a demonstrative illustration of cross-sectional view of a semiconductor structure in a step of manufacturing thereof according to one embodiment of present invention. More particularly, following the step illustrated in FIG. 5, embodiments of present invention provide applying a chemical-mechanical-polishing (CMP) process to planarize a top surface of the raw negative-tone organic dielectric layer 300. For example, in one embodiment, the CMP process may be applied until top surfaces of the set of metal pillars 211 are exposed. The planarization of the raw negative-tone organic dielectric layer 300 may produce a negative-tone organic dielectric (NTOD) layer 301 between the set of metal pillars 211. In other words, the set of metal pillars 211 may be embedded in the negative-tone organic dielectric layer 301.

FIG. 7 is a demonstrative illustration of cross-sectional view of a semiconductor structure in a step of manufacturing thereof according to one embodiment of present invention. More particularly, following the step illustrated in FIG. 6, embodiments of present invention provide, optionally, applying a selective etching process to recess the negative-tone organic dielectric layer 301 such that top surfaces of the negative-tone organic dielectric layer 301 may become slightly lower than top surfaces of the set of metal pillars 211. In other words, a top portion of the set of metal pillars 211 may be exposed by the recessing of the negative-tone organic dielectric layer 301 and thus may extrude from the negative-tone organic dielectric layer 301. The exposure of the top portion of the set of metal pillars 211 may ensure adequate contact and/or increase contact areas by the set of metal pillars 211 with one or more metal contacts of a redistribution layer that will be formed on top of the set of metal pillars 211, as being described below in more details.

After optionally recessing the negative-tone organic dielectric layer 301, embodiments of present invention provide forming a resist mask 401 on top of the negative-tone organic dielectric layer 301. The resist mask 401 may have one or more openings 402 that expose the set of metal pillars 211. In one embodiment, a portion of the negative-tone organic dielectric layer 301 surrounding the set of metal pillars 211 may be exposed by the resist mask 401.

FIG. 8 is a demonstrative illustration of cross-sectional view of a semiconductor structure in a step of manufacturing thereof according to one embodiment of present invention. More particularly, following the step illustrated in FIG. 7, embodiments of present invention provide forming a redistribution layer 410 in the one or more openings 402 of the resist mask 401. The formation of the redistribution layer 410 may be made through an electroplating process and the formed redistribution layer 410 may include one or more metal contacts 411, which may be self-aligned to the one or more openings 402. The one or more metal contacts 411 may be in direct contact with the one or more metal pillars 211 underneath thereof. In one embodiment, the one or more metal contacts 411 of the redistribution layer 410 may be made of a same material as the material of the set of metal pillars 211. For example, the one or more metal contacts 411 of the redistribution layer 410 and the set of metal pillars 211 may be made of copper (Cu).

When the negative-tone organic dielectric layer 301 is partially recessed to have a height that is slightly lower than the height of the set of metal pillars 211, the one or more metal contacts 411 of the redistribution layer 410 may be formed to have an inverted U-shape to saddle on top of the set of metal pillars 211. In other words, the set of metal pillars 211 may have a top portion that extrudes from the negative-tone organic dielectric layer 301. The top portion of the set of metal pillars 211 may intrude into the one or more metal contacts 411, thereby increasing contact areas between the one or more metal contacts 411 and the set of metal pillars 211, thereby resulting in more secured electronic contacts between the one or more metal contacts 411 and the set of metal pillars 211.

Figures 9, 10, 11:
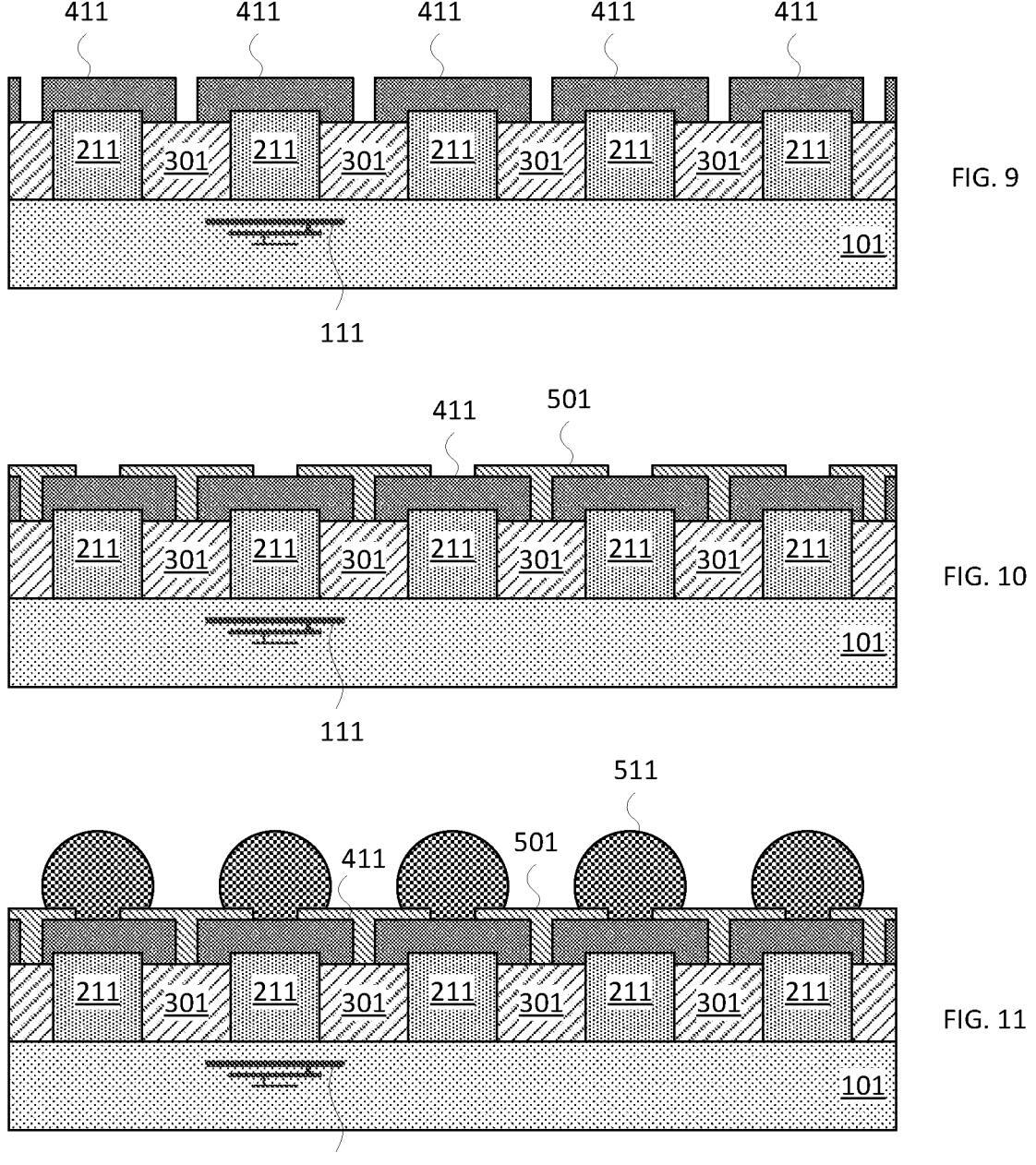

FIG. 9 is a demonstrative illustration of cross-sectional view of a semiconductor structure in a step of manufacturing thereof according to one embodiment of present invention. More particularly, following the step illustrated in FIG. 8, embodiments of present invention provide stripping the resist mask 401 between the one or more metal contacts 411 of the redistribution layer 410. The stripping of the resist mask 401 may be made through, for example, an ash process, and may create openings that expose the underneath negative-tone organic dielectric layer 301.

FIG. 10 is a demonstrative illustration of cross-sectional view of a semiconductor structure in a step of manufacturing thereof according to one embodiment of present invention. More particularly, following the step illustrated in FIG. 9, embodiments of present invention provide depositing a dielectric material on top of the one or more metal contacts 411 to form a dielectric layer 501. The dielectric layer 501 may also fill the openings between the one or more metal contacts 411 that are created by the removal of the resist mask 401. The dielectric layer 501 may subsequently be patterned to expose at least a portion of top surfaces of the one or more metal contacts 411.

FIG. 11 is a demonstrative illustration of cross-sectional view of a semiconductor structure in a step of manufacturing thereof according to one embodiment of present invention. More particularly, following the step illustrated in FIG. 10, embodiments of present invention provide forming one or more C4 (controlled collapse of chip connection) solders 511 on top of the dielectric layer 501 and in contact with the exposed portions of the one or more metal contacts 411 of the redistribution layer 410. The C4 solders 511 may be conductively connected to the redistribution layer 410, which is then conductively connected, via the one or more metal pillars 211, to the one or more metal lines of the BEOL structure 111 in the substrate 101.

FIG. 12 is a demonstrative illustration of a flow-chart of a method of manufacturing a semiconductor structure according to embodiments of present invention. The method includes (910) forming a plating resist layer on top of a substrate, the substrate includes one or more metal lines of a BEOL structure; (920) creating one or more openings in the plating resist layer in a lithographic patterning process with the one or more openings having a resolution better than a pre-defined value such as, for example, 5 μm; (930) electroplating a metallic material in the one or more openings to form a set of metal pillars, the metallic material may be copper, aluminum, tungsten or other suitable materials; (940) stripping the plating resist layer that surrounds the set of metal pillars, thereby exposing portions of the substrate; (950) forming a negative-tone organic dielectric layer on top of the set of metal pillars and on top of the exposed substrate, the negative-tone organic dielectric layer has good mechanical properties but a relatively low resolution such as a resolution no better than 5 μm and then cure the negative-tone organic dielectric layer in a flood exposure; (960) planarizing the negative-tone organic dielectric layer to expose top surface of the set of metal pillars; (970) forming a resist mask on the negative-tone organic dielectric layer, the resist mask having openings that expose the set of metal pillars; and (980) electroplating a redistribution layer with one or more metal contacts in the openings of resist mask, the one or more metal contacts in direct contact with the set of metal pillars.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A method comprising:
   forming a set of metal pillars on a substrate;
   forming a negative-tone organic dielectric layer covering the set of metal pillars;
   planarizing the negative-tone organic dielectric layer to expose the set of metal pillars;
   forming a resist mask on the negative-tone organic dielectric layer, the resist mask having openings that expose the set of metal pillars; and
   forming a redistribution layer in the openings of the resist mask, the redistribution layer being in direct contact with the set of metal pillars.

2. The method of claim 1, wherein forming the set of metal pillars comprises:

forming a plating resist layer on top of the substrate;
creating openings in the plating resist layer;
forming the set of metal pillars in the openings of the plating resist layer through an electroplating process; and
stripping the plating resist layer that surrounds the set of metal pillars.

3. The method of claim 1, wherein at least one of the metal pillars of the set of metal pillars has a horizontal dimension that is less than 5 μm.

4. The method of claim 1, further comprising curing the negative-tone organic dielectric layer through a flood exposure for a duration between about 100 ms and about 1000 ms and under an energy dose ranging from about 200 mJ/cm² to about 1000 mJ/cm² with ghi-line or i-line wavelengths.

5. The method of claim 1, wherein both the redistribution layer and the set of metal pillars are made of copper.

6. The method of claim 1, wherein the substrate includes one or more metal layers of a back-end-of-line (BEOL) structure, and the set of metal pillars are conductively connected to the one or more metal layers.

7. The method of claim 1, further comprising forming one or more C4 solders on top of and in direct contact with the redistribution layer.

8. A method comprising:
   forming one or more metal pillars on a substrate, the substrate including a back-end-of-line structure, the structure including one or more metal lines;
   forming a negative-tone organic dielectric layer on top of and covering the one or more metal pillars and the substrate;
   planarizing the negative-tone organic dielectric layer to expose top surfaces of the one or more metal pillars;
   forming a resist mask on the negative-tone organic dielectric layer, the resist mask having openings that expose the top surfaces of the one or more metal pillars; and
   electroplating a redistribution layer in the openings of the resist mask, the redistribution layer including one or more metal contacts, the one or more metal contacts in direct contact with the one or more metal pillars.

9. The method of claim 8, wherein forming the one or more metal pillars comprises:
   forming a plating resist layer on top of the substrate;
   creating openings in the plating resist layer in a lithographic patterning process;
   electroplating the one or more metal pillars in the openings in the plating resist layer; and
   stripping the plating resist layer that surrounds the one or more metal pillars.

10. The method of claim 8, wherein each of the one or more metal pillars has a horizontal dimension that is less than 5 μm.

11. The method of claim 8, wherein the negative-tone organic dielectric layer has a resolution no better than 5 μm.

12. The method of claim 8, wherein both the one or more metal contacts of the redistribution layer and the one or more metal pillars are made of copper.

13. The method of claim 8, further comprising forming one or more C4 solders on top of and in contact with the one or more metal contacts of the redistribution layer.

* * * * *